(12) United States Patent
Krishna et al.

(10) Patent No.: US 9,416,013 B2
(45) Date of Patent: Aug. 16, 2016

(54) RAPID REDUCTION OF SODIUM OCCUPANCY IN TYPE II SILICON CLATHRATE BY CHEMICAL ETCHING

(71) Applicants: Lakshmi Krishna, Golden, CO (US); Eric Toberer, Golden, CO (US); Adele Tamboli, Golden, CO (US)

(72) Inventors: Lakshmi Krishna, Golden, CO (US); Eric Toberer, Golden, CO (US); Adele Tamboli, Golden, CO (US)

(73) Assignee: Colorado School of Mines, Golden, CO (US)

( * ) Notice: Subject to any disclaimer, the term of this patent is extended or adjusted under 35 U.S.C. 154(b) by 0 days.

(21) Appl. No.: 14/612,002

(22) Filed: Feb. 2, 2015

(65) Prior Publication Data
US 2015/0376016 A1   Dec. 31, 2015

Related U.S. Application Data

(60) Provisional application No. 61/934,024, filed on Jan. 31, 2014.

(51) Int. Cl.
*C01B 33/021* (2006.01)
*C01B 33/037* (2006.01)
*H01L 35/22* (2006.01)

(52) U.S. Cl.
CPC ............. *C01B 33/021* (2013.01); *C01B 33/037* (2013.01); *H01L 35/22* (2013.01)

(58) Field of Classification Search
CPC ........ C01B 33/021; C01B 33/037; H01L 35/22
See application file for complete search history.

(56) References Cited

U.S. PATENT DOCUMENTS

| | | | | |
|---|---|---|---|---|
| 7,534,414 B2 * | 5/2009 | Nolas | .................. | B22F 9/004 423/592.1 |
| 2013/0280609 A1 * | 10/2013 | Chan | .................... | C01B 33/021 429/218.1 |

OTHER PUBLICATIONS

Horie et al., "Controlled thermal decomposition of NaSi to derive silicon clathrate compounds," Journal of Solid State Chemistry 182 (2009) 129-135.*
Horie et al., "Controlled thermal decomposition of NaSi to derive silicon clathrate compounds," Journal of Solid State Chemistry, 2009, vol. 182(1), pp. 129-135, 2 pages, abstract only.
Wagner et al., "Electrochemical Cycling of Sodium-Filled Silicon Clathrate," ChemElectroChem Communications, 2013, 8 pages.
Gryko et al., "Low-density framework form of crystalline silicon with a wide optical and gap," Physical Review B, 2000, vol. 62(12), pp. R7707-R7710.

* cited by examiner

*Primary Examiner* — Anthony J Zimmer
(74) *Attorney, Agent, or Firm* — Sheridan Ross P.C.

(57) ABSTRACT

The invention relates to a method to produce a type II silicon clathrate, a method to produce a type I clathrate, and a method to decrease sodium in silicon clathrates.

9 Claims, 11 Drawing Sheets

RAPID REDUCTION OF SODIUM OCCUPANCY IN TYPE II SILICON CLATHRATE BY CHEMICAL ETCHING

CROSS REFERENCE TO RELATED APPLICATIONS

This application claims priority under 35 U.S.C. §119(e) to U.S. Provisional Patent Application Ser. No. 61/934,024 filed Jan. 31, 2014, which is incorporated herein in its entirety by reference.

GOVERNMENT LICENSE RIGHTS

This invention was made with government support under grant number DMR-0820518 awarded by the National Science Foundation. The government has certain rights in the invention.

FIELD OF THE INVENTION

The invention relates to a method to produce a type II silicon clathrate, a method to produce a type I clathrate, and a method to decrease sodium in silicon clathrates.

BACKGROUND

Elemental silicon in the diamond structure (d-Si) dominates the semiconductor industry, whereas a lesser known allotrope of silicon, the $Si_{136}$ type II clathrate structure, has only recently attracted attention as a wide band gap (1.8 eV) semiconductor material. Experimental demonstration of a tunable, nearly direct band gap across the $Si_{136}$—$Ge_y$ alloy suggests the potential for photovoltaic and other optoelectronic applications. Silicon clathrates are also actively being investigated as anode materials for lithium ion batteries due to their high charge storage capacity.

Figure 1A:
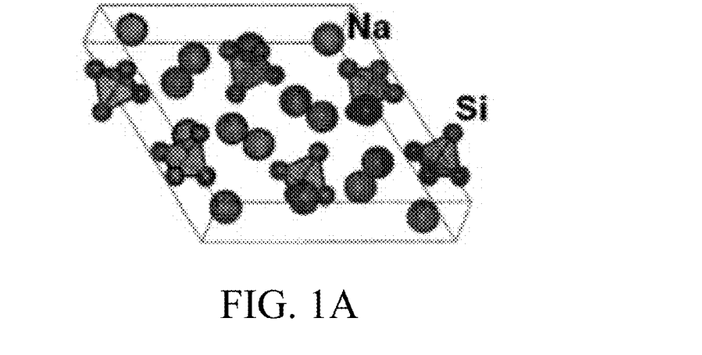
Figure 1B:
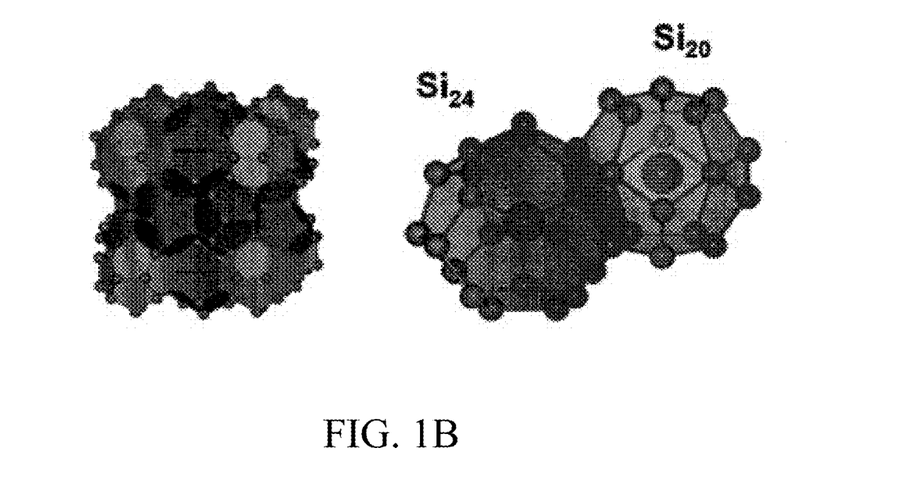
Figure 1C:
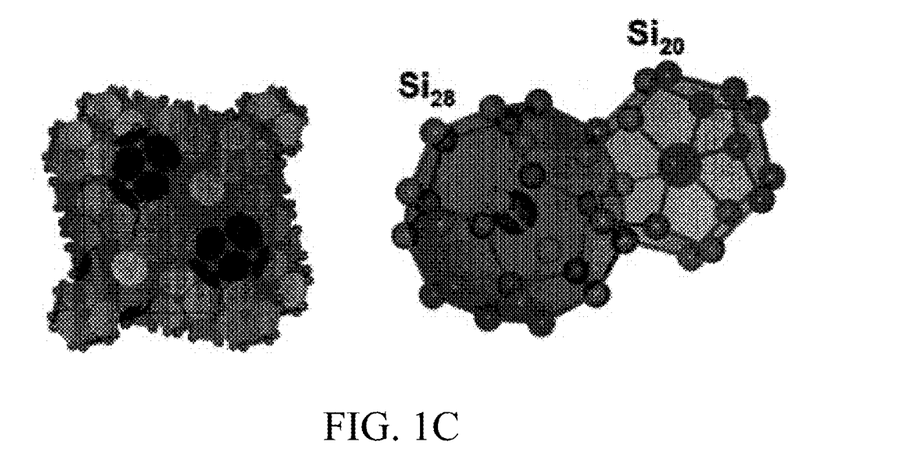

Type I clathrates based on silicon have been demonstrated as thermoelectric materials and superconductors. These silicon clathrate structures are based on periodic arrangements of covalent silicon cages ($Si_{20}$, $Si_{24}$, $Si_{28}$) as illustrated in FIG. 1. FIG. 1 (a) illustrates NaSi (monoclinic, space group C2/c) is thermally decomposed to form the silicon clathrates. FIG. 1 illustrates the unit cells and constitute a polyhedral of type I (illustrated in FIG. 1 (b)) and type II clathrates (illustrated in FIG. 1(c)). The silicon clathrates are composed of a covalently bound silicon framework surrounding by isolated sodium ions (which is illustrated in the center of each silicon clathrate cage). Guest atoms within these large cages have been found to 'rattle', thereby lowering the thermal conductivity of these clathrate materials. The interconnected nature of the cages that make up the clathrate structure also provides opportunities for gas transportation and storage.

Silicon clathrates have been synthesized in type I ($A_8Si_{46}$) and type II structures ($A_{24}Si_{136}$) with the guest atom A typically being a group I or II element (Na, K, Rb, Cs or Ba) or combinations thereof. These low density silicon frameworks can be endohedrally doped by the presence of a guest atom in the cage. The electropositive guest species donate electrons to the framework, leading to extremely high ($\sim 10_{22}$ cm$^{-3}$) free electron densities and metallic behavior. Achieving controllable guest occupancies is critical for semiconducting applications.

To date, there have been no reports of guest atom removal from the type I silicon clathrate structure. In the case of the type II structure, most of the guest atoms can be evacuated by heating the clathrate structure under vacuum over a period of several days. However, it is non-trivial to attain less than several thousand ppm guest concentration. Frequently, type II clathrate synthesis is carried out by the thermal decomposition of the corresponding Zintl monosilicide phase (e.g. NaSi) under vacuum. During thermal decomposition, it is hypothesized that cation sublimation leads to charge imbalance in the mono-silicide, which causes subsequent rearrangement and bonding of silicon atoms into the four-coordinate cage structures of the clathrate. During this process, the remaining cations are expected to template cage formation. In-situ measurements suggest there may be some topotactic character to this transformation. Other synthetic techniques such as ionic liquid synthesis, spark plasma sintering, and more recently, synthesis by vapor-phase intercalation of sodium or K into graphite have been investigated.

All of these techniques offer attractive routes to explore new inorganic crystal phases, however, simultaneous phase selectivity and scale-up have been challenging. The seminal work in controlling phase selectivity was conducted by Horie et al., *Controlled Thermal Decomposition of NaSi to Derive Silicon Clathrate Compounds*, J. Solid State Chem., 2009, 182, pp. 129-135, who developed initial trends in phase selection based on temperature and local sodium vapor pressure. Upon decomposition of 20 mg loads of NaSi precursor, Horie et al. found that clathrate phase selection (type I or II) was heavily dependent on temperature and vapor pressure. In Horie, the crucible was partially covered to increase the local sodium vapor pressure and was found to increase the phase fraction of type I clathrate. However, understanding the details of how sodium vapor pressure influences the phase selection is difficult as the local sodium vapor pressure depends heavily on temperature (bulk sodium diffusion, sublimation rate and sodium saturation pressure). In a recent publication Wagner, et al., *Electrochemical Cycling of Sodium-Filled Silicon Clathrate*, ChemElectroChem, Sep. 23, 2013, DOI: 10.1002/celc.201300104, it was reported that the conditions for the synthesis of high purity type II silicon clathrate as reported by Horie et al. was not reproducible. Along with large scale, phase selective synthesis it is extremely important to demonstrate techniques for reducing the guest concentration to achieve semiconducting type II silicon clathrates. Sodium concentrations as low as 3000 ppm (x=0.5; $Na_xSi_{136}$) has been achieved by repeated heating of the type II clathrate under vacuum a process that takes multiple days. Intermediate HCl washing of the powder was used to remove sodium products (e.g. oxides) which build up on the surface. Further reduction in sodium concentration has been achieved by reacting the low sodium type II silicon clathrate with iodine vapor to form NaI. Repeating this process several times resulted in a small quantity of type II silicon clathrate with sodium guest atom concentration of 35 ppm. Once a low (x<2) sodium content is achieved in the type II clathrate, it can be separated from the type I and d-Si impurities through centrifugation.

SUMMARY

The invention relates to novel methods to produce type I and type II silicon clathrates, and methods to etch type II clathrates to reduce the presence of type I silicon clathrates and sodium by reducing the sodium content of type I clathrates and selectively reducing the amount of type I clathrate.

An aspect of the invention is a silicon clathrate. The phase fraction of the silicon clathrate includes less than about 5 wt. % of a type I silicon clathrate, greater than about 83 wt. % of a type II silicon clathrate and less than about 4 wt. % of sodium. The silicon clathrate is washed with an alcohol to produce a washed silicon clathrate, then subjected to an acid solution to produce a slurry. The solids are silicon clathrate is recovered from a slurry. The type II silicon clathrate is washed with an alcohol then subjecting to an acid solution to produce a slurry. The slurry is filtered and the filtrate recovered is the type II silicon clathrate with reduced sodium.

An aspect of the invention is a method to produce a type II silicon clathrate by heating NaH powder and Si powder for a heating time between about 24 hours to about 72 hours at a heating temperature between about 350° C. and about 450° C. in the absence of oxygen. The powders are milled, then mixed to produce NaSi powder. The NaSi powder is annealed for between about 1 hour and about 24 hours at about 200° C. and about 300° C. The NaSi powder is then thermally decomposing in a chamber with a cold plate, where the temperature of the cold plate is less than a melting point of sodium. The chamber is maintained at a decomposition temperature between about 300° C. and about 400° C., and a pressure between about 0.5 mTorr and about 5 mTorr. The resulting powder has a phase fraction of the product comprises between about 80 wt. % to about 95 wt. % of the type II silicon clathrate.

An aspect of the invention is a method to produce a type I silicon clathrate by providing NaSi to a hot reactor, and providing compressed sodium to a chamber to increase a vapor pressure of sodium in the reactor to produce a product comprising type I silicon clathrate.

An aspect of the invention is a method to reduce sodium occupancy of a type II silicon clathrate. The method includes washing the type II silicon clathrate with an alcohol, followed by an acid solution wash, which produces a slurry. The slurry is filtered to recover the type II silicon clathrate with reduced sodium.

BRIEF DESCRIPTION OF THE DRAWINGS

FIG. 1 (a) illustrates NaSi thermally decomposed to form the silicon clathrates.

FIG. 1 (b) illustrates the unit cells and constitute polyhedral of type I clathrates;

FIG. 1 (c) illustrates the unit cells and constitute a polyhedral of type II clathrates;

FIG. 4 (a) illustrates a comparison of X-Ray Diffraction (XRD) patterns of about 0.5 g of NaSi decomposed at about 370° C. for 24 hours using a modified hot wall;

FIG. 4 (b) illustrates a comparison of XRD patterns of about 0.5 g of NaSi decomposed at about 370° C. for 24 hours using a traditional hot wall;

FIG. 4 (c) illustrates a comparison of XRD patterns of about 0.5 g of NaSi decomposed at about 370° C. for 24 hours using a cold wall reactor;

DETAILED DESCRIPTION

The invention relates to novel methods to produce type I and type II silicon clathrates, and methods to etch type II clathrates to reduce the presence of type I silicon clathrates and sodium.

One aspect of the invention is a method to produce a silicon clathrate. The method to produce a silicon clathrate includes heating NaH powder and Si powder for a heating time between about 24 hours to about 72 hours at a heating temperature between about 350° C. and about 450° C. in the absence of oxygen. The NaH powder and the Si powder are milled, then mixed to produce NaSi powder. The NaSi powder is annealed for an annealing time between about 1 hour and about 24 hours at an annealing temperature of between about 200° C. and about 300° C. to produce annealed NaSi powder. The annealed NaSi powder is then thermally decomposing in a chamber, wherein the chamber comprises a cold plate. The temperature of the cold plate is less than a melting point of sodium, and the chamber is maintained at a decomposition temperature between about 300° C. and about 400° C., and a pressure between about 0.5 mTorr and about 5 mTorr to produce a product. The phase fraction of the product comprises between about 80 wt. % to about 95 wt. % of the type II silicon clathrate.

In some embodiments, the heating time is between about 24 hours to about 72 hours. In some embodiments, the heating time can between about 36 hours to about 50 hours. In some embodiments, the heating time can be about 48 hours. The heating temperature is between about 350° C. and about 450° C. The heating temperature can be between about 370° C. to about 400° C. In some embodiments, the heating temperature may be about 395° C. Because NaH and Si are both highly reactive with oxygen, the heating step, milling step, and mixing step occur in the absence of oxygen. This environment may be achieved by purging the environment with a noble gas, such as helium gas, argon gas, nitrogen gas, combinations thereof or other suitable inert gases. The NaH powder and the Si powder can be milled to an average diameter size of less than about 1 micron, in some embodiments about less than about 200 nm. The molar ratio of the NaH to Si can be about between about 1:1 and 1.6:1. By increasing the ratio of NaH to Si to about 1.6:1, NaSi can be synthesized without a secondary silicon phase. Once the NaH and Si powders are reacted to become NaSi, the NaSi powder may be compacted into a pellet or may remain in a powder form.

The NaSi powder is annealed for between about 1 hour and about 24 hours. In some embodiments, the NaSi powder can be annealed for between about 2 hours and about 10 hours. In some embodiments, the NaSi powder can be annealed for about 3 hours. The annealing temperature is between about 200° C. and about 300° C. The annealing temperature can be between about 225° C. and about 275° C. In some embodiments, the annealing temperature can be about 250° C.

Type II Silicon Clathrate

If a type II silicon clathrate is desired, then the annealed NaSi powder is thermally decomposed in a chamber comprising a cold plate. The cold plate may be made of any thermally conductive metal, including but not limited to copper, titanium, aluminum, alloys, and the like. During the decomposition step, the temperature of the cold plate is less than the melting temperature of sodium. In some embodiments, the cold plate is less than about 200° C. In some embodiments, the cold plate temperature may be less than about 150° C., about 100° C., about 50° C. or about 25° C. In some embodiments, the cold plate is maintained at a temperature of about 25° C. The NaSi powder is subjected to a decomposition temperature between about 300° C. and about 400° C. In some embodiments, the decomposition temperature can be between about 350° C. and about 375° C. In some embodiments, the decomposition temperature can be about 370° C. The decomposition pressure in the chamber is between about 0.5 mTorr and about 5 mTorr. In some embodiments, the chamber pressure can be between about 0.75 mTorr and about 1.5 mTorr. In some embodiments, the chamber pressure can be about 1 mTorr.

The vapor pressure in the chamber may be controlled to provide either a type I silicon clathrate or a type II silicon clathrate. When a type II silicon clathrate is desired, a low sodium vapor pressure within the chamber is desired. This low sodium vapor pressure may be accomplished by providing the sodium in a powdered form, and by the use of a cold plate within the chamber, whereby sodium may sublimate to the cold plate, thereby reducing the local vapor pressure in the chamber.

The phase fraction of the NaSi product following decomposition includes between about 80 wt. % to about 95 wt. % of the type II silicon clathrate. In some embodiments, the phase fraction of the NaSi product following decomposition can also include between about 3 wt. % to about 10 wt. % of type I silicon clathrate, between about 2 wt. % to about 10 wt. % of silicon, and between about 0 wt. % to about 10 wt. % of sodium. The phase fraction of the type I silicon clathrate can be between about 3.5 wt. % to about 5 wt. %. The phase fraction of silicon can be between about 4 wt. % and about 7.5 wt. %. The phase fraction of sodium can be between about 0 wt. % and about 4 wt. %. The formula for the NaSi can be $Na_xSi_{136}$, wherein x can be between 2 and about 18. In some embodiments, x can be 2, 3, 9 or 18.

In some embodiments, type II silicon clathrates can be subjected to an etching step to further remove sodium and type I silicon clathrates from the type II silicon clathrates. When type I silicon clathrate is present along with type Ii silicon clathrate, the etching technique can selectively remove type I silicon clathrate. The etching step includes rinsing the type II silicon clathrate with an alcohol, followed by etching the type II silicon clathrate with an acid solution. The alcohol may be any suitable alcohol, including, methanol, ethanol, isopropanol, and the like. In some embodiments, the alcohol can be ethanol. The acid solution may include any suitable acid, including but not limited to, hydrofluoric acid, nitric acid, and combinations of acids, such as a solution comprising hydrofluoric acid and nitric acid. In some embodiments, the acid solution includes hydrofluoric acid and nitric acid. In some embodiments, the acid solution can comprises between about 1 vol. % to about 5 vol. % of hydrofluoric acid and between about 5 vol. % to about 15 vol. % of nitric acid. In some embodiments, the acid solution can comprise 3 vol. % hydrofluoric acid and 10 vol. % nitric acid.

Type I Silicon Clathrate

If a type I silicon clathrate is desired, then the annealed NaSi powder is thermally decomposed in a hot reactor chamber, in a sodium rich environment to produce a product comprising type I silicon clathrate. The sodium may pressed into a pellet or disc in order to provide a high local vapor pressure environment in the reactor. The ratio of type I silicon clathrate to type II silicon clathrate in the product can be between about 1:1. In some embodiments, the phase fraction of type I silicon clathrate in the product can be between about 20 wt. % to about 90 wt. %. The phase fraction of type II silicon clathrate in the product can be between about 10 wt. % to about 40 wt. %. The phase fraction of silicon in the product can be between about 5 wt. % to about 10 wt. %. The phase fraction of sodium in the product may be about 0 wt. %. The formula for the NaSi can be $Na_xSi_{136}$, wherein x can be between 11 and about 15. In some embodiments, x can be 11, 14 or 15.

The temperature in the hot reactor is between about 360° C. and about 400° C. In some embodiments, the hot reactor can be at a temperature between about 360° C. to about 380° C. In some embodiments, the temperature of the hot reactor is about 370° C.

In some embodiment, when a type I silicon clathrate is desired, the reaction occurs in a sodium rich environment. While the sodium rich environment may be provided by adding excess sodium to the reactor, in other embodiments, compressed sodium, for example, sodium compressed as a pressed disc or pellet of sodium may provided to the reaction to provide a high local vapor pressure environment.

Removal of Type I Silicon Clathrate and Sodium from Type II Silicon Clathrates

Another aspect of the invention is a method to reduce sodium occupancy of a type II silicon clathrate by washing the silicon clathrate with an alcohol to produce a washed silicon clathrate, and subjecting the washed silicon clathrate to an acid solution to produce a silicon clathrate with reduced sodium.

The alcohol may be any suitable alcohol, including, methanol, ethanol, isopropanol, and the like. In some embodiments, the alcohol can be ethanol. While the alcohol may be at any temperature, in some embodiments, the alcohol can be at room temperature (about 25° C.). The acid solution may include any suitable acid, including but not limited to, hydrofluoric acid, and nitric acid, however, the acid should not be hydrochloric acid. In some embodiments, the acid solution includes hydrofluoric acid and nitric acid. In some embodiments, the acid solution can comprises between about 1 vol. % to about 5 vol. % of hydrofluoric acid and between about 5 vol. % to about 15 vol. % of nitric acid. In some embodiments, the acid solution can comprise 3 vol. % hydrofluoric acid and 10 vol. % nitric acid. The acid solution may be at any suitable temperature, including at room temperature. The alcohol washed silicon clathrate can be subjected to the acid solution for between about 10 minutes and about 2 hours. In some embodiments, about 15 minutes.

In some embodiments, the type II silicon clathrate can comprise greater than about 80 wt. % of type II silicon clathrate. In some embodiments, the type II silicon clathrate comprises less than about 10 wt. % of type I clathrate. The type I silicon clathrate present in the silicon clathrate can also be removed by subjecting the type II silicon clathrate to the alcohol and acid solutions.

EXAMPLES

NaSi Synthesis

NaSi was synthesized by heating NaH (95%, Aldrich) and Si (99.9999%, Alfa Aesar) in a molar ratio of about 1.6:1 in a covered alumina crucible for about 48 hours at about 395° C. under flowing Ar. Following the procedure of Ma, et al., NaH and Si powders were ball-milled for 1 hour to facilitate mixing of the powders and increase their reactivity. The resulting NaSi sample was then annealed under dynamic vacuum for about 3 hours at about 250° C. to remove excess Na. Three methods were undertaken to thermally decompose NaSi into the clathrate phase. All reactions were carried out at 370° C. under dynamic vacuum (~1 mTorr).

Hot Walled Method

Figure 2A:
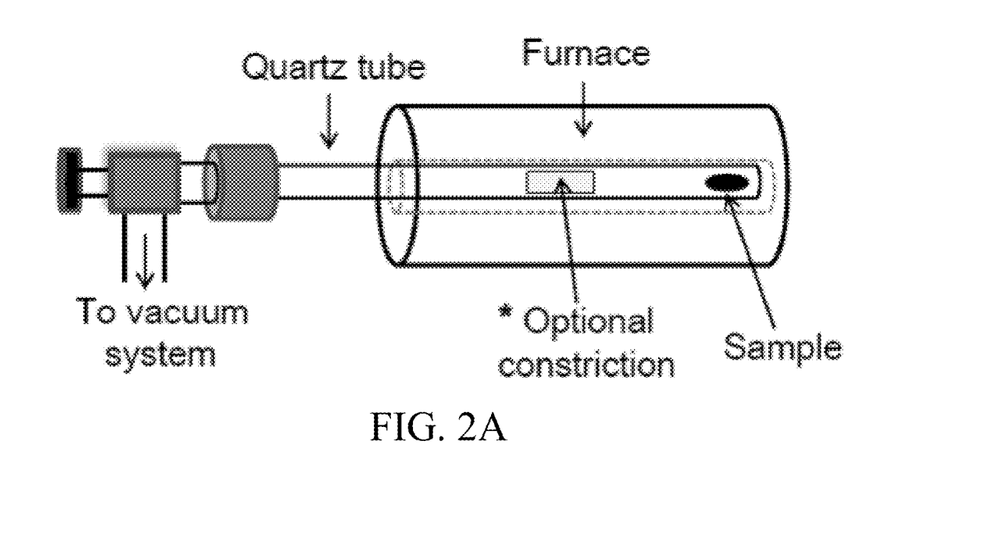
FIG. 2(a) illustrates a thermal decomposition chamber using the hot wall approach.

The first method, illustrated in FIG. 2(a), is the frequently used hot wall approach wherein the quartz tube (1" inner diameter) containing the sample is heated under dynamic vacuum in a tube furnace. In this method, a short section of the quartz tube protrudes outside the furnace.

Modified Hot Walled Method

To test the impact of increased sodium vapor pressure on the thermal decomposition of NaSi, the hot wall approach was modified by constricting the diameter (about 90% reduction) of the quartz tube by inserting a quartz rod (labeled with an asterisk in FIG. 2(a)). This modified hot wall approach constitutes the second method.

Cold Plate Reactor

Figure 2B:
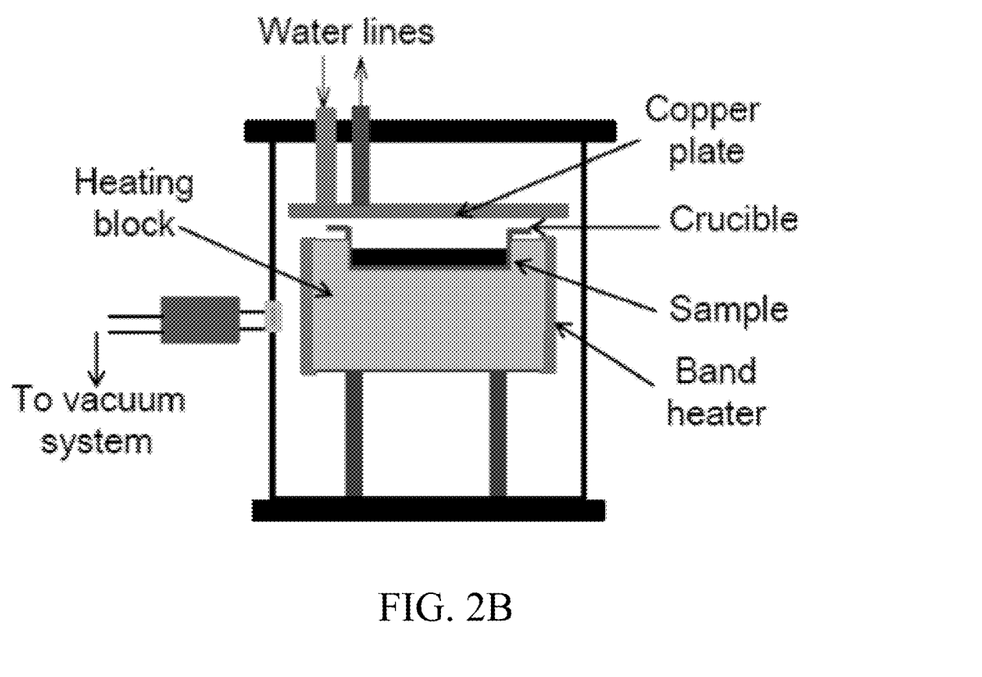
FIG. 2(b) illustrates a thermal decomposition chamber using the cold wall approach.

The third method, a cold plate reactor, was designed to maintain low sodium vapor pressure during thermal decomposition. To achieve the lowest possible sodium vapor pressure, a system was designed which employed local heating of the sample in conjunction with a water cooled plate (at 25° C.) inside the reaction chamber as illustrated in FIG. 2(b). The cold plate was designed to have sodium vapor irreversibly deposit onto it following sublimation from the sample. The crucible containing the sample was heated by clamping it to a heating block and the cold plate was placed just above the crucible. The clamping of the crucible to the heating block ensured good thermal contact with a maximum temperature difference of about 25° C. between the crucible and the heating block. A PID-controlled band heater was used to set the temperature of the heating block, which was measured by an embedded thermocouple. The sample temperature was measured by a second thermocouple embedded in the crucible. The temperature of the copper plate was maintained at about 25° C., significantly below the melting point of Sodium, by circulating chilled water through it and monitoring the plate temperature using a third thermocouple.

Sodium Occupancy

Sodium occupancy was controlled in the cold plate reactor, clathrate with large x was heated at about 370° C. under vacuum to achieve x≤1. In a second approach, sodium occupancy was reduced using an acidic solution 3 vol. % HF/10 vol. % nitric acid ($HNO_3$) solution. Prior to exposure of the clathrate to the acid solution, residual elemental sodium must first be removed by washing in ethanol prior to the $HF/HNO_3$ immersion to avoid explosive splattering of the $HF/HNO_3$ solution. Following ethanol washing, the clathrate powder was slowly added to the etchant and the solution was sonicated for a fixed amount of time (for example, up to about 15 minutes). The clathrate powder was recovered from the solution by passing through a Nalgene filtration set-up equipped with 1 mm Millipore filter paper.

X-Ray Diffraction (XRD)

A PANalytical X-ray diffractometer (X'Pert Pro) operating with a Cu Kα radiation tube (voltage of about 45 kV, and tube current of about 40 mA) was used to identify the phases present. Care should be taken when acquiring NaSi diffraction data due to its pyrophoric nature. A custom XRD sample holder was employed which featured a protective Kapton cover and was loaded under argon. Rietveld refinement on the XRD results was conducted with the GSAS suite. A $LaB_6$ NIST standard sample was used to generate the instrument file to be used with GSAS.

Electron Spin Resonance

Electron spin resonance (ESR) measurements were carried out on a Bruker EMX EPR spectrometer at 10 K. The patterns were recorded over 1000 G range and centered over g=2.0. A modulation amplitude of about 1 G, acquisition time of about 163.84 ms and about 20 mW microwave power was used to acquire the spectra. About 25 mg clathrate samples were loaded in about 5 mm quartz tubes for all the ESR runs.

NMR

Magic angle spinning (MAS) solid-state $^{29}Si$ nuclear magnetic resonance (NMR) spectra of type II silicon clathrate samples, spinning at about 12 kHz, was obtained at room temperature using a Bruker AVANCE III (about 400 MHz) spectrometer. Samples were loaded in an about 4 mm $ZrO_2$ rotor with Kel-F end caps. Tetramethylsilane was used as a standard for reference measurement. The repetition time was about 20 ms and a total of 1024 scans were obtained for each clathrate sample.

NaSi Synthesis

Figure 3:
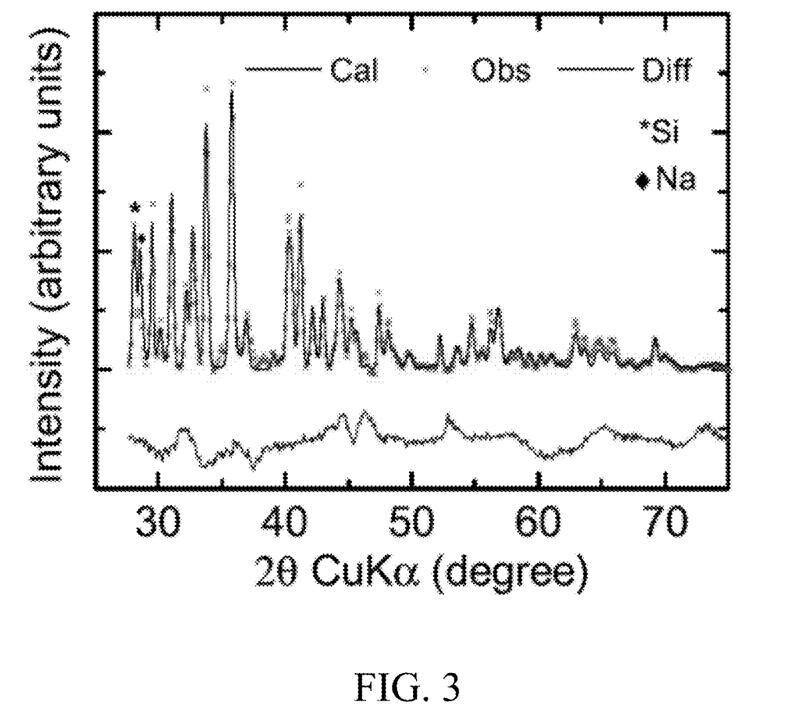
FIG. 3 illustrates a Rietveld refinement of the as-synthesized NaSi reveals the synthesized precursor.

Preparation of the clathrates via thermal decomposition requires synthesis of NaSi as a precursor. Rietveld refinement of the as-synthesized NaSi reveals the synthesized precursor is about 91.4 wt. % NaSi, along with unreacted sodium (about 4.3 wt. %) and d-Si (about 4.3 wt. %) as illustrated in FIG. 3. The excess sodium is removed by an additional 3 hours anneal at about 250° C. This low Si level is a product of tuning the molar ratio of the reactants (NaH:Si) and minimization of diffusion lengths provided by fine grained Si. To confirm that NaSi is a stable phase at elevated temperatures, about 0.5 g of powder at 370° C. in an ampule sealed under vacuum. Following isothermal heating for about 24 hours, no change was observed in the XRD pattern.

Clathrate Phase Selection

NaSi thermal decomposition conditions were explored to investigate how vapor pressure determines phase selection as NaSi transforms to the clathrates. A traditional 'hot wall' reactor (illustrated in FIG. 2(a)) was used as a baseline to replicate prior efforts.

The impact of local sodium vapor pressure was investigated by considering two alternative reactor geometries: a modified hot wall and a cold plate (higher and lower sodium vapor pressure than the standard approach, respectively). Local vapor pressure of sodium is exceptionally difficult to measure directly. All discussion of vapor pressure herein is inferred from observation of sodium deposition and reactor geometry. In all reactions, approximately 0.5 g of NaSi powder was decomposed at about 370° C. for about 24 hours.

Most of the high-yield type II Si clathrate syntheses report extensive annealing of NaSi (about 12-60 hours) before thermal decomposition. No such precursor annealing was required for the type II clathrate synthesis described herein.

Initial Exploration of Sodium Vapor Pressure

Figure 4A:
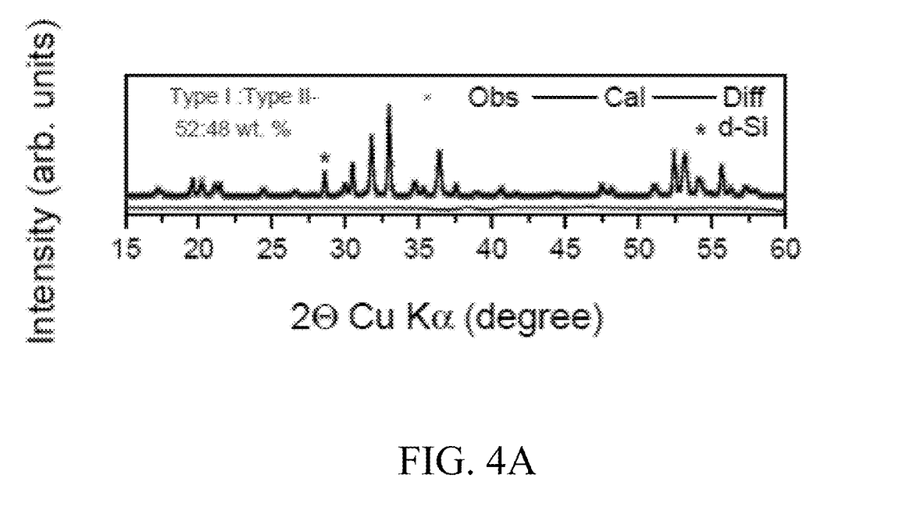
Figure 4B:
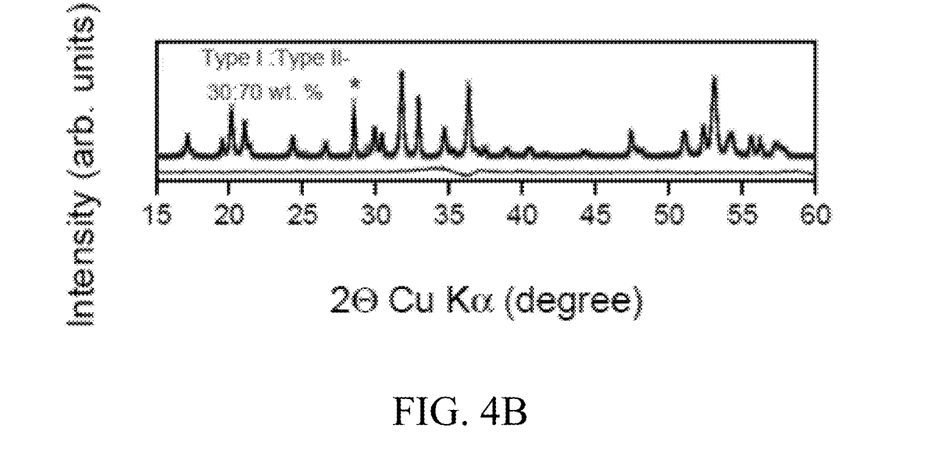
Figure 4C:
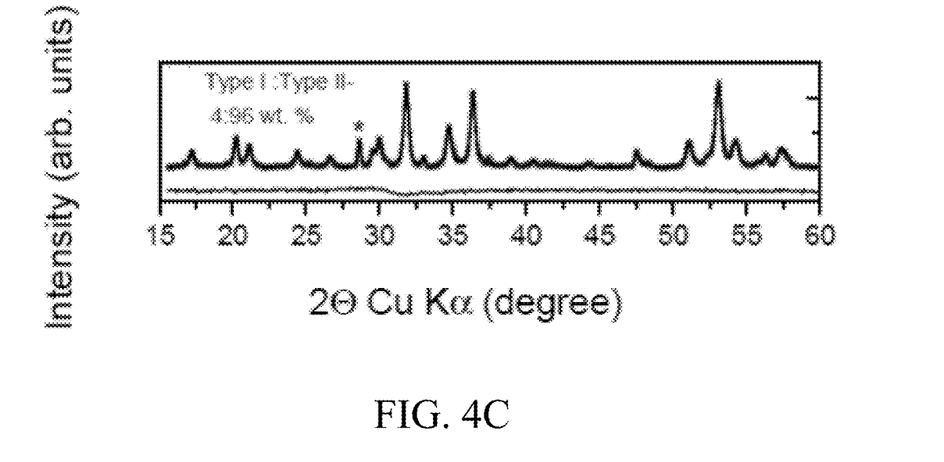
Figure 4D:
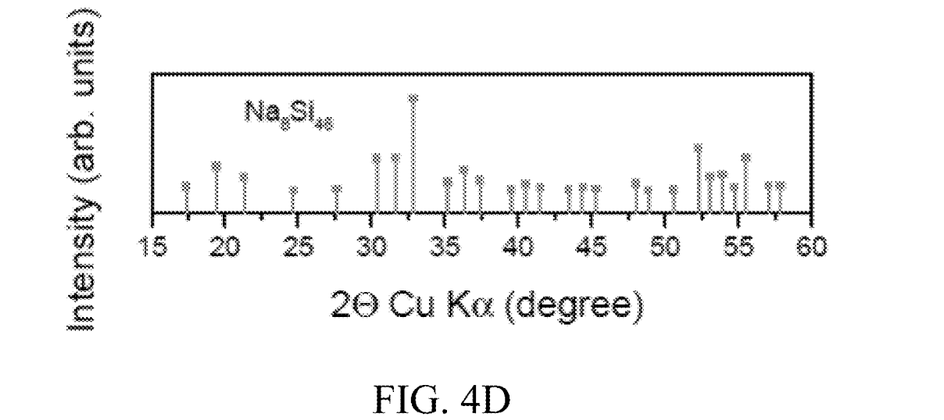
FIG. 4(d) illustrates an XRD of $Na_8Si_{146}$.
Figure 4E:
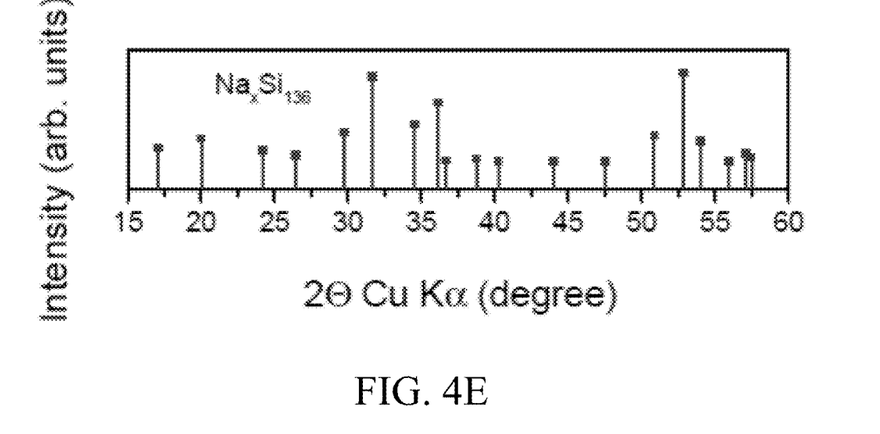
FIG. 4(e) illustrates a XRD of $Na_xSi_{136}$.

FIG. 4 illustrates a comparison of XRD patterns of about 0.5 g of NaSi decomposed at about 370° C. for 24 hours using a modified hot wall (FIG. 4(a)) and hot wall (FIG. 4(b)) and a cold wall reactor (FIG. 4(c)). FIG. 4(d) illustrates an XRD of $Na_8Si_{146}$ and FIG. 4(e) illustrates a XRD of $Na_xSi_{136}$. As illustrated in FIG. 4, the analysis of XRD indicated that tuning vapor pressure at constant temperature (370° C.) controls phase selection. High yields of type I result from high sodium vapor pressure while type II forms under low sodium vapor pressure. All phase fraction data obtained from Rietveld refinement (R.R) are given in Table 1. The values illustrated in Table 1 are approximate.

TABLE 1

| Synthesis | Quantity (form) | Decomp. time (h) | R.R. G.O.F. ($\chi^2$) | Phase fraction (wt. %) Type I | Type II | Si | Na | x ($Na_xSi_{136}$) |
|---|---|---|---|---|---|---|---|---|
| Hot wall (modified) | 0.5 g (powder) | 24 | 6.9 | 49.0 | 45.4 | 5.6 | — | 15 |
| Hot wall | 0.5 g (powder) | 24 | 7.9 | 24.2 | 67.5 | 8.3 | — | 11 |
| Cold plate | 0.5 g (powder) | 24 | 4.8 | 3.5 | 89.7 | 4.3 | 2.5 | 18 |
| Cold plate | 0.5 g (powder) | 48 | 9.4 | 3.6 | 86.0 | 6.7 | 3.7 | 3 |
| Cold plate | 0.5 g (powder) | 72 | 8.6 | 5.0 | 83.8 | 7.4 | 3.8 | 2 |
| Hot wall | 2 g (pellet) | 48 | 11.4 | 84.5 | 9.5 | 6.0 | — | 14 |
| Cold plate | 2 g (powder) | 48 | 6.5 | 5.0 | 88.7 | 6.3 | — | 9 |

Quantitative phase analysis of the sample decomposed under the highest sodium vapor pressure (modified hot wall) reveals a type I to type II wt. % ratio of 52:48. (in calculating the type I:type II wt. % ratio, the presence of additional d-Si phase is ignored to focus on the clathrate phase selectivity). In contrast, the traditional hot wall approach yields a 30:70 wt. % ratio. By minimizing sodium vapor pressure with a cold plate geometry, a 4:96 type I:type II wt. % ratio was obtained. In these results, secondary d-Si content is largely determined by the purity of the NaSi precursor. Some additional d-Si results from the hot wall approaches. However, the decomposition of NaSi in the cold plate reactor does not appear to yield additional d-Si as a side product. Trace sodium metal in the XRD pattern, which may be residual from the precursor synthesis or result from condensation of sodium from the vapor phase on cooling. The total sodium content of the type II structure is determined by Rietveld refinement of the sodium fractional occupancy. The refinement of sodium occupancy in the type I structure resulted in completely occupied guest sites. A larger x in the constricted geometry existed when comparing the occupancy of the modified and open hot wall reactors. This suggests that, following clathrate formation, the sodium sublimation is dictated by the local vapor pressure. A larger x in the cold wall reactor existed when comparing the occupancy of the hot and cold wall reactors. This result is difficult to interpret due to differences in crucible and reactor geometry and differences in type I/II phase fraction.

Scaleup

Figure 5A:
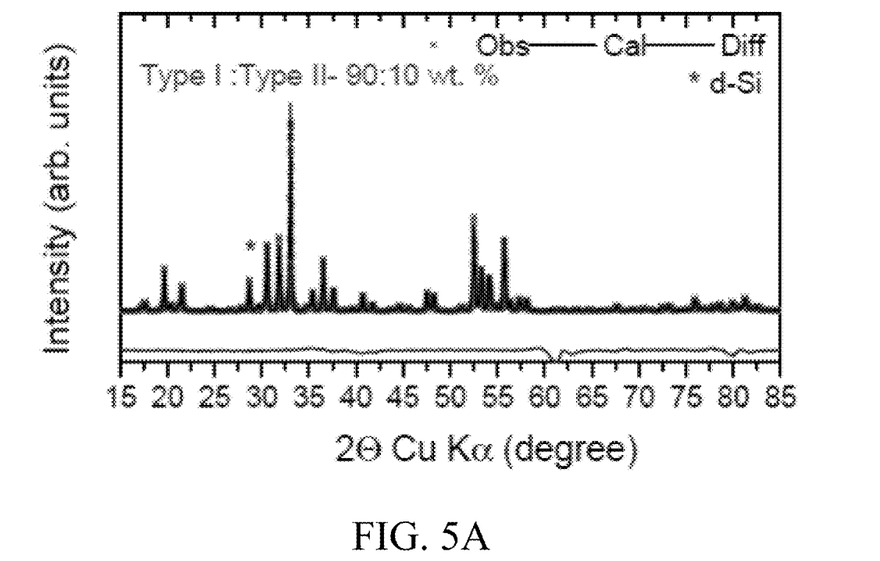
FIG. 5(a) illustrates the XRD pattern for a hot walled reactor synthesis with a cold-pressed pellet.
Figure 5B:
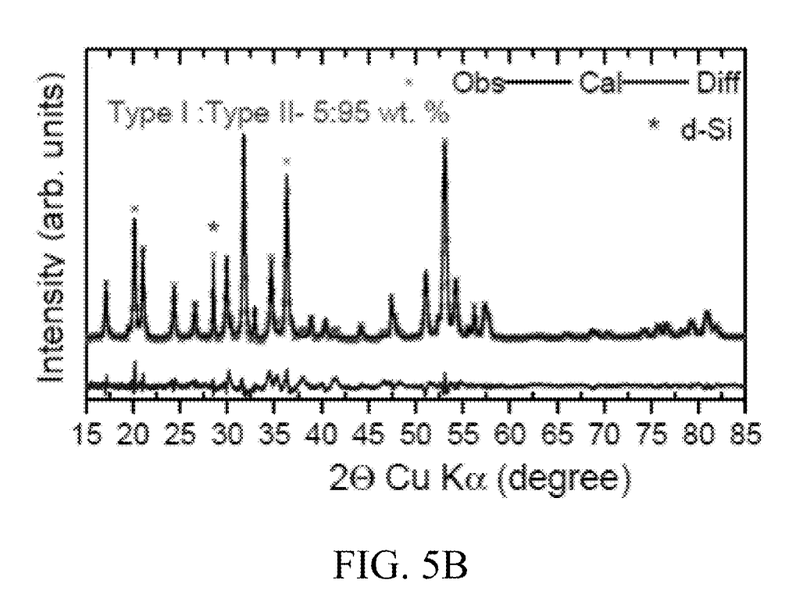
FIG. 5(b) illustrates a cold plate reactor synthesis in powder form.

Table 1 also illustrates an attempt at scaling up the production of NaSi. Approximately 2 g loads were pursued within both the hot wall and cold plate reactors (as illustrated in FIG. 5). The NaSi samples were decomposed at about 370° C. for about 48 hours. FIG. 5(a) illustrates the XRD pattern for a hot walled reactor synthesis with a cold-pressed pellet, while FIG. 5(b) illustrates a cold plate reactor synthesis in powder form. Rietveld refinement included $Na_xSi_{136}$, $Na_8Si_{146}$, and d-Si phases. The hot wall reactor is well-suited for forming type I; here the sodium vapor pressure was controlled by cold-pressing a NaSi pellet to 75% density. In this variation, local constrictions (internal porosity) achieve a similar effect (high local vapor pressure) as a macroscopic reactor constriction.

Na Removal Using Cold Plate Approach

Figure 6:
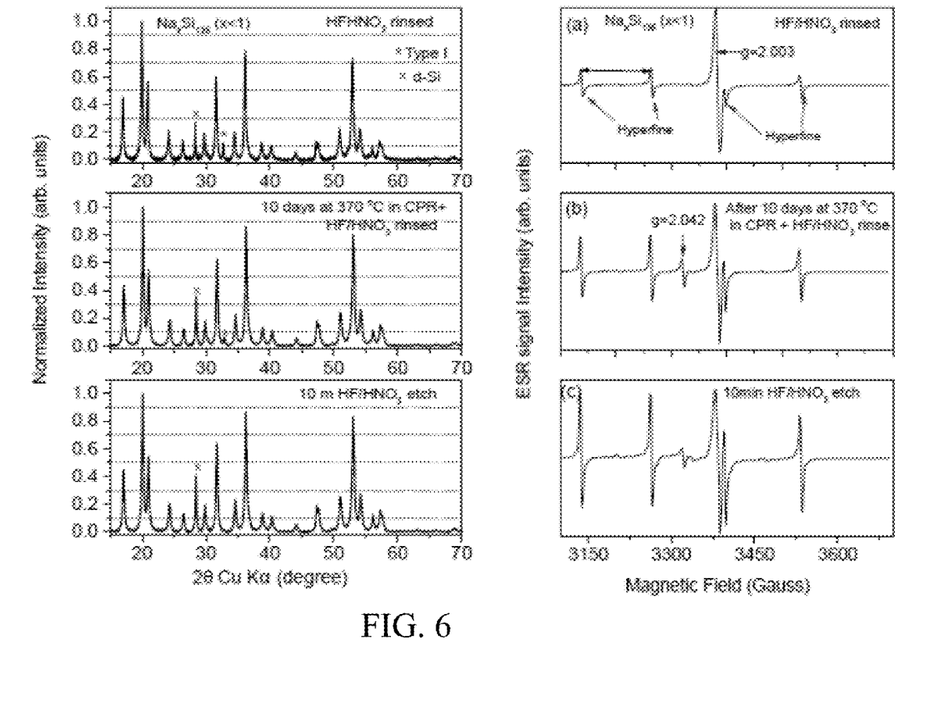
FIG. 6 illustrates the subsequent sodium removal in the cold plate reactor and the effect on the sodium occupancy.
Figure 7:
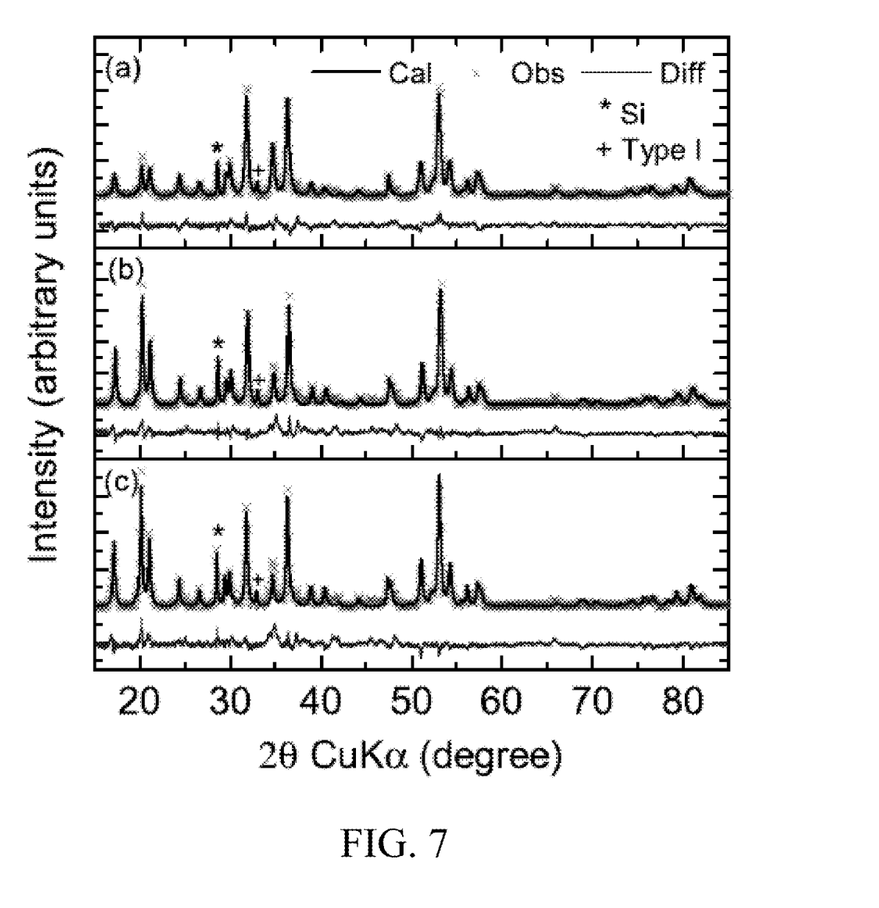
FIG. 7 illustrates the phase fractions after about 24 hours and about 48 hours for samples.

Beyond forming type II clathrate in high phase fraction and quantity, the cold plate reactor also proves effective at removing sodium from the type II clathrate. XRD data was collected at about 24 hours increments over about 72 hours to monitor sodium levels within the clathrate, with a final measurement after an additional 10 days. After about 24 hours at about 370° C., the NaSi was completely decomposed to the clathrate phase (Table 1). On average, the occupancy was $Na_{18}Si_{136}$, with the $Si_{28}$ cage fully occupied and the $Si_{20}$ cage only partially filled. Subsequent sodium removal in the cold plate reactor led to significant decrease in sodium occupancy as illustrated in FIG. 6. The phase fractions are similar after about 24 hours and about 48 hours but the intensity of the peaks around 20°2θ has significantly increased, indicating low sodium occupancy as illustrated in FIG. 7. After a total reaction time of about 72 hours, $Na_2Si_{136}$ is obtained. Annealing for an additional 10 days led to a continued decrease in sodium occupancy, as described in the ESR section below. In comparison to prior hot wall reactor approaches, the synthesis time to reach low sodium is quite rapid. Additionally, these low sodium levels are achieved with minimal annealing of the NaSi precursor, unlike prior efforts which required annealing between about 12-60 hours. Further, this synthesis technique did not require intermittent washing with HCl to remove accumulated material on the surface of the powder. No significant phase change from type II to type I was observed during sodium removal.

HF/HNO$_3$ Etch

Figure 8A:
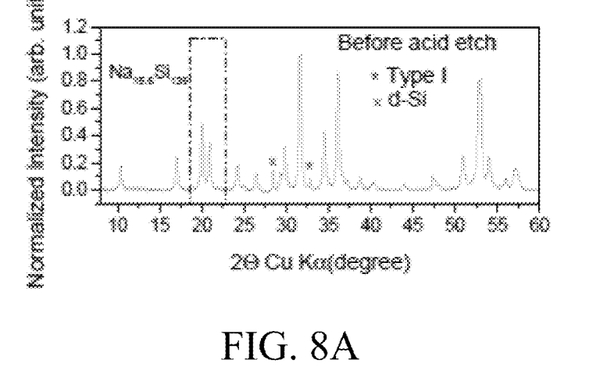
FIG. 8(a) illustrates XRD patterns of the sample before acid etch.
Figure 8B:
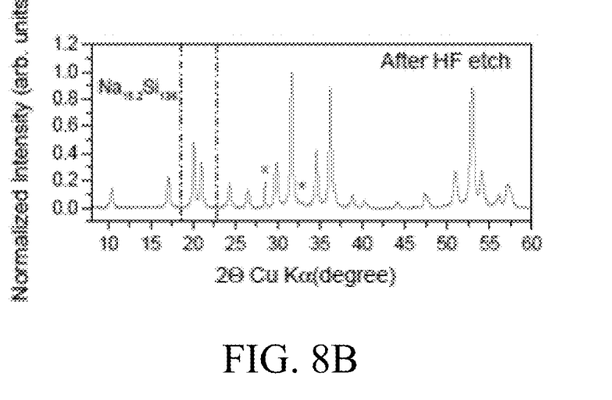
FIG. 8(b) illustrates XRD patterns for the sample after 15 min HF acid etch.
Figure 8C:
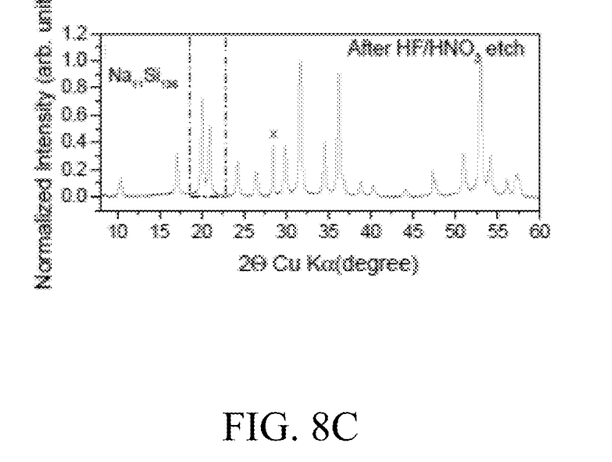
FIG. 8(c) illustrates XRD patterns for the sample after 15 min $HF/HNO_3$ acid etch.

Annealing the filled type II clathrate under vacuum has been shown to evacuate the sodium guest atoms from the cage. However, this process is slow, especially when sodium levels below x<1 are desired. HF/HNO$_3$ solutions are well known to be dopant selective etches for d-Si. A $Na_{15.4}Si_{136}$ clathrate powder, synthesized in the cold plate reactor, was immersed in 3 vol. % HF and 3 vol. % HF/10 vol. % HNO$_3$ solution at room temperature and sonicated for about 15 minutes. The clathrate powders were washed with ethanol prior to the dissolution in the acid. This step is critical because when not treated with ethanol, the residual sodium impurity phase present in the clathrate powder will react violently with acids. FIG. 8 illustrates XRD patterns of the sample before acid etch (a), after 15 min HF acid etch (b), and after 15 min HF/HNO$_3$ acid etch (c). Before etching, the sample has a sodium occupancy of about 15.4. About 15 minutes after the HF etching results in a reduction in type I phase, but no significant change in the sodium occupancy of the type II phase. HF/HNO$_3$ treatment is found to completely remove the type I impurity phase and significantly reduce the sodium content in the type II phase. After 15 min of HF/HNO$_3$ etch, the sodium content was reduced from 15.4 to 11. This can be readily observed in FIG. 8, where the increase in peak intensity around 20°2θ relative to peaks around 35°2θ indicates a decrease in sodium occupancy. HCl washing has no significant effect on the clathrate powder.

The selective character of the HF/HNO$_3$ etch (targeting type I) may be due to differences in crystal structure or may be akin to the dopant-selective etching of d-Si in HF/HNO$_3$. HF is known to etch the oxide layer formed on d-Si but does not rapidly etch d-Si. Consistent with this understanding, HF has minimal impact on the type II clathrate. The etching of d-Si in HF/HNO$_3$ acid follows a two step process. First, the silicon is oxidized by HNO$_3$ and the second step is the dissolution of the oxidized solution in HF. In clathrates, the presence of the sodium guest in the cages acts as an electron donor and may encourage local etching of Na-rich regions.

XRD, ESR and NMR Analysis of Na$_x$<$_1$S$_{136}$

Rietveld refinement of powder XRD data is an excellent technique to determine the sodium occupancy for sodium concentrations greater than a few atomic percent. However, this approach is inaccurate for low sodium containing type II silicon clathrate (typically for x<0.5). ESR has been a useful technique to probe the low sodium levels. ESR measurements were recorded on three low sodium type II and a type I silicon clathrate samples. All the measurements were recorded at 10 K using the same acquisition parameters. In the case of a type I clathrate, a peak centered around g=2.003 was observed, but with significantly less intensity than the central line observed in type II clathrate samples at the same g value. The presence of this line in type I sample could be partially due to the presence of ~<10 wt. % type II phase.

Figure 9:
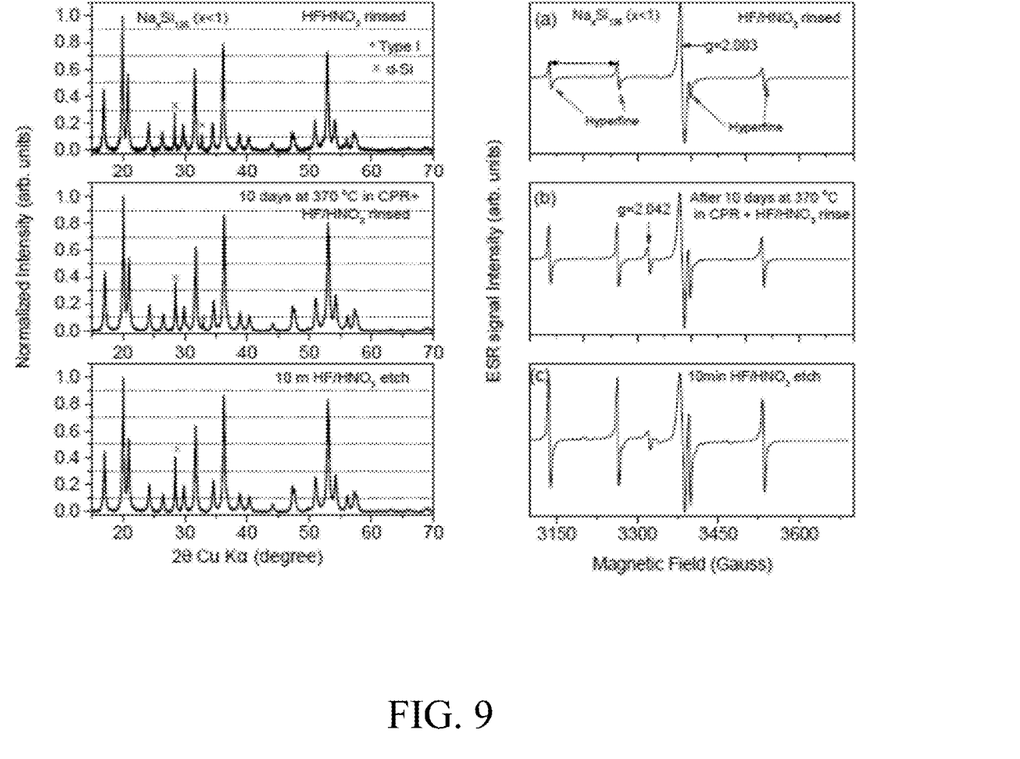
FIG. 9 illustrates the XRD and ESR spectra of three low sodium type II (x<1) samples synthesized.

FIG. 9 illustrates the XRD and ESR spectra of three low sodium type II (x<1) samples synthesized. NaSi was thermally decomposed at 370° C. in the cold plate reactor (CPR) for three days, yielding predominately type II clathrate. This sample will be referred to as the as-synthesized sample. From this parent batch, three low sodium type II samples were prepared: Sample (a)—the as-synthesized sample was briefly rinsed with HF/HNO$_3$ solution; sample (b) the as-synthesized sample was heated at 370° C. for 10 days in CPR followed by a brief HF/HNO$_3$ rinse and sample (c)—as-synthesized sample was etched for about 10 minutes in HF/HNO$_3$ solution. All samples were treated with the HF/HNO$_3$ solution to eliminate trace Na-containing impurity phases which could affect the ESR results. The peak intensities of type II phase in the XRD patterns (FIG. 9 (left-side)) for all three samples (a, b and c) are very similar. Type I phase was removed when a HF/HNO$_3$ etch was used. There is a slight increase in the d-Si phase fractions in the sample (c). Though, the excess d-Si phase could be separated by centrifugation or dissolving in NaOH, the ESR studies on the samples (a, b and c) were performed without removal of d-Si so as to study primarily the effect of HF/HNO$_3$ etch on the samples synthesized.

The ESR spectrum of type II clathrates shows a wealth of features relating to the interaction of the sodium guest with the silicon framework atoms (illustrated in FIG. 9 (right)). The three primary features of the spectra are: a strong, narrow peak centered at g=2.003 (close to the free electron g-value), which is present in all the samples. The origin of this peak is speculated to be due to the conduction electron. The presence of four main quartet lines (near 3137 G, 3264 G, 3340 G, and 3530 G) resulting from the hyperfine interaction of sodium's spin-3/2 nucleus with its valence electron. The separation of the hyperfine lines is on average 133 Gauss. This number, together with the atomic coupling constant of an isolated sodium atom (316 Gauss), indicate that approximately 40% of the sodium electron's spin density sits on the sodium atom while the balance resides on the surrounding silicon cage, consistent with previously reported value. The third feature is a well defined line centered at g=2.042. Earlier ESR reports observed a broad line at this g-value which was attributed to sodium clusters in which the 3s electrons interact with several sodium nuclei. In contrast, our ESR spectrum is the first report of a well defined line instead of a broad hump at g=2.042. The origin of this line remains unclear. An additional fourth feature is clearly seen in panel (c) halfway between the hyperfine lines. The occurrence of these features has been attributed to sodium dimers which would then result in a septet. The first, third, fifth, and seventh line of the septet are overlapped by the hyperfine lines. However associating these features to sodium dimers is not convincing since when two coupled spin 3/2 nuclei interact the resulting septet should have an expected intensity ratio of 1:2:3:4:3:2:1. This is not the case here. Hence the possibility of a forbidden transaction (DML=1) cannot be ruled out.

Quantitative analysis of sodium occupancy from ESR spectra can be achieved by comparing the integrated peak intensities between an unknown and standard sample with known doping. Under similar acquisition conditions, the ratio of peak intensities should scale linearly with the doping ratio. For the standard sample, a Na$_5$Si$_{136}$ sample was utilized with x determined by Rietveld refinement. Surprisingly, the integrated peak intensity of the Na$_1$Si$_{136}$ was found to be greater than a standard sample.

ESR analysis of low sodium samples conducted by Ammar et. al., showed that with reducing sodium occupancy, the intensity of hyperfine lines increases relative to the center line (g=2.003). FIG. 9 illustrates the $^{29}$Si NMR spectrum of HF/HNO$_3$ rinsed clathrate of sample a. The NMR spectrum shows peaks corresponding to the three unique crystallographic sites of Si in the type II clathrate structure as well as trace d-Si and a-SiO$_2$.

The foregoing description of the present invention has been presented for purposes of illustration and description. Furthermore, the description is not intended to limit the invention to the form disclosed herein. Consequently, variations and modifications commensurate with the above teachings, and the skill or knowledge of the relevant art, are within the scope of the present invention. The embodiment described hereinabove is further intended to explain the best mode known for practicing the invention and to enable others skilled in the art to utilize the invention in such, or other, embodiments and with various modifications required by the particular applications or uses of the present invention. It is intended that the appended claims be construed to include alternative embodiments to the extent permitted by the prior art.

The invention claimed is:

1. A method to produce a type II silicon clathrate, comprising:
   heating NaH powder and Si powder for a heating time between about 24 hours to about 72 hours at a heating temperature between about 350° C. and about 450° C. in the absence of oxygen;
   milling the NaH powder and the Si powder;
   mixing the milled NaH powder and milled Si powder to produce NaSi powder;
   annealing the NaSi powder for an annealing time between about 1 hour and about 24 hours at an annealing temperature of between about 200° C. and about 300° C. to produce annealed NaSi powder; and
   thermally decomposing the NaSi powder in a chamber, wherein the chamber comprises a cold plate, wherein the temperature of the cold plate is less than a melting point of sodium, wherein the chamber is maintained at a decomposition temperature between about 300° C. and about 400° C., and wherein a pressure in the chamber is between about 0.5 mTorr and about 5 mTorr to produce a product, wherein a phase fraction of the product comprises greater than about 80 wt. % of the type II silicon clathrate.

2. The method of claim 1, wherein the decomposition temperature is about 370° C.

3. The method of claim 1, further comprising providing sodium powder to the chamber.

4. The method of claim 1, wherein the temperature of the cold plate is about 25° C.

5. The method of claim 1, wherein the phase fraction of the product further comprises between about 3 wt. % to about 10 wt. % of a type I silicon clathrate, between about 2 wt. % to about 10 wt. % of silicon, and between about 0 wt. % to about 10 wt. % of sodium.

6. The method of claim 1, further comprising decreasing a weight percentage of sodium in the product, comprising:
    rinsing the product with an alcohol;
    etching the product in the presence of an acid solution to produce a slurry; and
    filtering the slurry.

7. The method of claim 6, wherein the alcohol is ethanol.

8. The method of claim 6, wherein the acid solution comprises hydrofluoric acid and nitric acid.

9. The method of claim 8, wherein the acid solution comprises between about 1 vol. % to about 5 vol. % of the hydrofluoric acid and between about 5 vol. % to about 15 wt. % of $HNO_3$.

* * * * *